United States Patent [19]

Clifton

[11] Patent Number: 5,331,591
[45] Date of Patent: Jul. 19, 1994

[54] ELECTRONIC MODULE INCLUDING A PROGRAMMABLE MEMORY

[75] Inventor: Mark B. Clifton, Robbinsville, N.J.

[73] Assignee: AT&T Bell Laboratories, Murray Hill, N.J.

[21] Appl. No.: 11,567

[22] Filed: Feb. 1, 1993

[51] Int. Cl.$^5$ .............................................. G11C 13/00
[52] U.S. Cl. ..................................... 365/182; 365/51
[58] Field of Search ............. 365/51, 189.01, 230.01, 365/182

[56] References Cited

U.S. PATENT DOCUMENTS

| | | | |
|---|---|---|---|
| 4,437,718 | 3/1984 | Selinko | 339/61 |
| 4,706,165 | 11/1987 | Takenaka et al. | 361/403 |
| 4,706,166 | 11/1987 | Go | 361/403 |
| 4,807,021 | 2/1989 | Okumura | 357/75 |
| 4,884,237 | 11/1989 | Mueller et al. | 365/63 |
| 4,983,533 | 1/1991 | Go | 437/7 |
| 5,146,428 | 9/1992 | Tanimura | 365/51 |
| 5,157,588 | 10/1992 | Kim et al. | 361/396 |

*Primary Examiner*—Terrell W. Fears
*Attorney, Agent, or Firm*—Robert B. Levy

[57] ABSTRACT

An electronic module (10) includes a processor (12), having a set of contacts (26) coupled to a set of metallized areas (24) on a first device carrier (16), and a programmable memory device (14), having a set of contacts (40) coupled to each of a set of conductive members (46) depending from a second device carrier (33) stacked above the first carrier. Interposed between the two device carriers is an interposer layer (48), a routing layer (60) and a conduction layer (70) which collectively provide a path between a separate first metallized area (24) on the first device carrier and a conductive member (46) on the second device carrier to couple the processor to the memory. At least one clip (72) releasably secures the second device carrier to the first device carrier to allow the second device carrier to be separated so that the programmable memory device can be programmed off-line.

9 Claims, 2 Drawing Sheets

ELECTRONIC MODULE INCLUDING A PROGRAMMABLE MEMORY

TECHNICAL FIELD

This invention relates to an electronic module fabricated by stacking one electronic device, such as a memory, above another device, such as a microprocessor or digital signal processor.

BACKGROUND OF THE INVENTION

The advent of miniaturization in the field of electronics has led to the development of programmable processors, such as microprocessors and digital signal processors, which are now commonplace within a wide variety of electronic systems. Each processor typically has an associated a Read-Only Memory (ROM) for storing instructions. The instructions, when executed by the processor, cause the processor to perform one or more functions. Advances in the design and fabrication of such processors now allow them to be fabricated with an internal ROM, thereby avoiding the need for an external ROM for program storage as was required in the past.

Usually, the internal ROM contained in today's processors is mask-programmed. In other words, the ROM within the processor is programmed by appropriately arranging the transmissive and non-transmissive portions of one or more masks which are employed to photolithographically define each layer of the processor during fabrication. Since the programming of the internal ROM is an integral part of the fabrication of the processor, modifying or altering the program requires that a new processor be fabricated. Often, the lead time required to obtain a new processor with a differently mask-programmed ROM is relatively long.

When developing an electronic system incorporating a processor, there is often a need during development to reprogram the ROM associated with the processor. Indeed, the program contained within the ROM may undergo a large number of alterations or modifications before a final "production" version of the electronic system is created. For this reason, an external ROM is often employed for program storage in place of the internal ROM during development to facilitate such frequent reprogramming.

However, in some instances, it may not be possible to employ an external ROM because of space requirements. With many products, the amount of space available for mounting components is limited, with little extra room for an external ROM that will be used only during system development. Without the ability to employ an external ROM, a designer may be forced to utilize the internal processor ROM, thus incurring long lead times when the program in the ROM must be changed.

This, there is a need for an electronic module which occupies the same area (i.e., "footprint") as a processor, but contains both the programmable processor and a reprogrammable ROM, the latter being separable from the processor to facilitate off-line reprogramming thereof.

SUMMARY OF THE INVENTION

Briefly, in accordance with a preferred embodiment of the invention, an electronic module is provided with a reprogrammable memory device releasably secured to a processor in a vertical stack so as to occupy an area not substantially larger than that of the processor itself. The electronic module comprises a first device carrier having first metallized areas arrayed on a first surface, and first conductive members, each depending from a second, opposed surface, with each first conductive member being electrically connected to a separate first metallized area. The first device carrier carries the processor which has a set of contacts, each electrically connected to a separate first metallized area.

Overlying the first device carrier but spaced therefrom is a second device carrier which carries the programmable memory device. The second device carrier has a first surface with a plurality of second metallized areas arrayed thereon corresponding to an array of contacts on the programmable memory device. The second device carrier has a second, opposed surface from which depends a set of second conductive members, arrayed the same as, and each electrically connected to, a separate one of the second metallized areas.

Interposed between the two device carriers is an intermediate layer having an opening therein sized to receive the processor. The intermediate layer has a plurality of third metallized areas on a first surface arrayed the same as the second conductive members on the second device carrier. The intermediate layer has a second, opposed major surface having a plurality of third conductive members depending therefrom, each connected to a separate one of the third metallized areas, but arrayed the same as for mechanical attachment to, and electrical connection with, the first metallized areas on the first device carrier.

A conduction layer is interposed between the first surface of the intermediate layer and the second surface of the second device carrier for providing an electrical path between each second conductive member of the second device carrier and each third metallized area on the intermediate layer. The second device carrier and the conduction layer are releasably held by a retaining mechanism to the intermediate layer in a vertical stack so that each second conductive member on the second device carrier is electrically connected through the intermediate layer and the conduction layer to a corresponding first metallized area on the first device carrier. In this way, each contact on the programmable memory device is electrically connected to a corresponding contact on the processor. The resultant module yields a vertically stacked arrangement which occupies an area not substantially larger than that of the processor itself. By releasing the retaining mechanism, the second device carrier can be separated from the intermediate layer so that the programmable memory device can be programmed off-line.

DETAILED DESCRIPTION

Figure 1:
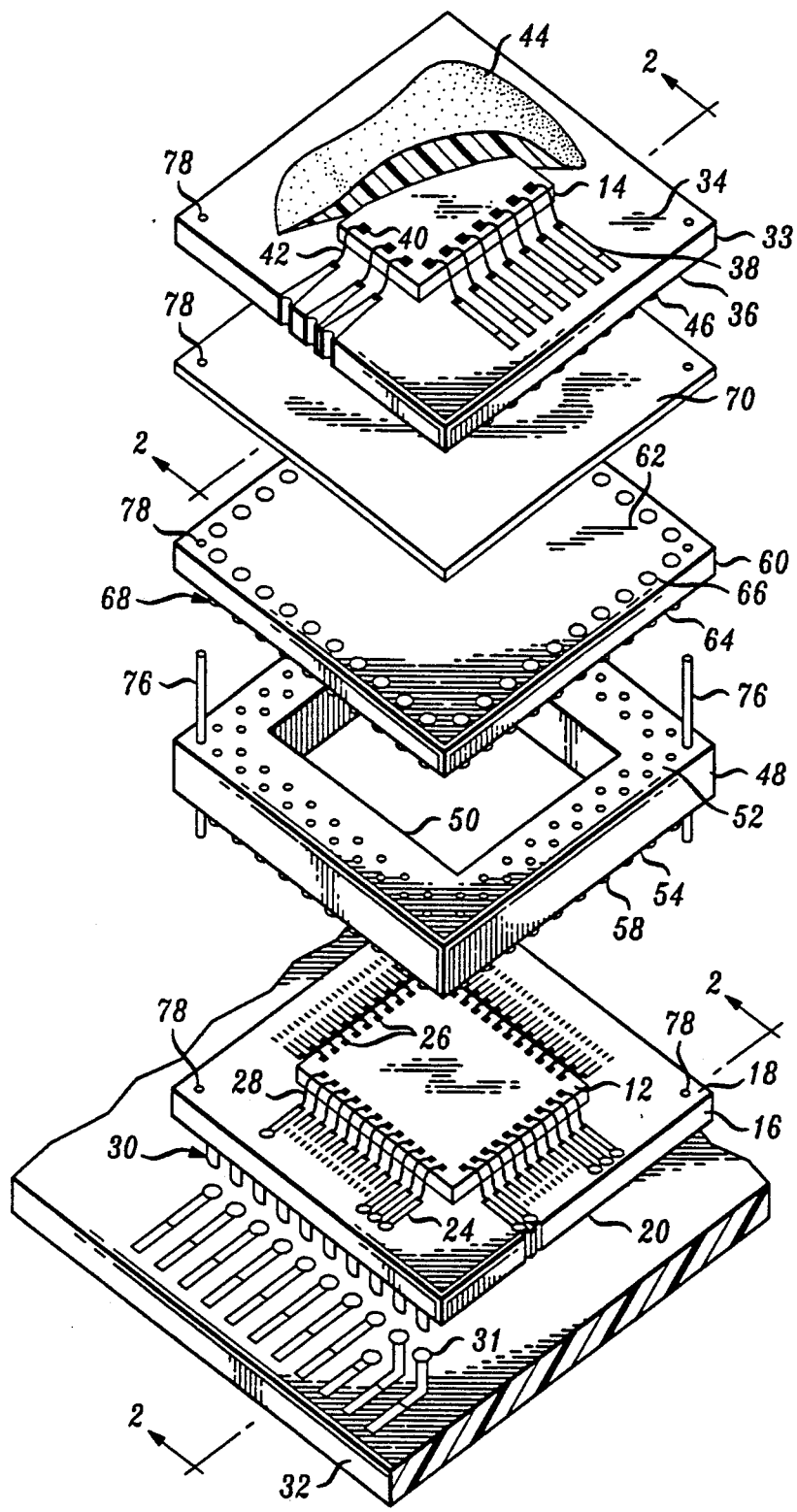
FIG. 1 is an exploded, perspective view of an electronic module in accordance with a preferred embodiment of the invention.

FIG. 1 shows an electronic module 10, in accordance with the invention, which incorporates both a processor 12 and an interconnected programmable memory device 14, vertically stacked above the processor. In the preferred embodiment, the processor 12 typically takes the form of a microprocessor or digital signal processor while the programmable memory device 14 typically takes the form of an Electrically Programmable, Read-Only Memory (EPROM). Both the processor 12 and the programmable memory device 12 are depicted as unpackaged semiconductor dies or chips. Alternatively, the processor 12 and the programmable memory device 14 could each take the form of a packaged device (not shown).

The module 10 includes a first device carrier 16 for carrying the processor 12. In the preferred embodiment, the first device carrier 16 takes the form of substrate (e.g., ceramic, glass-epoxy or FR-4), which has opposed, first and second major surfaces 18 and 20. The first surface 18 of the first device carrier 16 has a plurality of metallized areas 24 arrayed thereon corresponding to an array of electrical contacts 26 on the processor 12. An electrical connection between each contact 26 and each metallized area 24 is accomplished by bonding a separate one of the ends of a wire 28 thereto using a conventional wire-bonding process. Should the processor 12 be configured of a packaged device having a plurality of leads (not shown), each lead would be electrically connected to a corresponding one of the metallized areas 24 by solder or a conductive epoxy.

The first device carrier 16 has a plurality of conductive members 30 (e.g., solder bumps formed of a high-temperature solder) depending from its second major surface 20. Each conductive member 30 is bonded to a metallized area (or a die paddle if formed of a bare die) (not shown) on the second surface 20, which area, in turn, is electrically connected (i.e., by a metallized via (not shown)) to a corresponding one of the metallized areas 24 on the first major surface 18. Depending on the number of input/output connections to be made to the processor 12, the conductive members 30 may be arrayed in four separate rows, each row being parallel to a separate one of the device carrier edges. Alternatively, the conductive members 30 can be arranged in a matrix ("land-grid") array as is well known in the art. The conductive members 30 enable the first device carrier 16 to be bonded to, so as to make electrical contact with, an array of metallized areas 31 on a printed wiring board 32 which may carry other modules in addition to the module 10, as well as one or more discrete components (not shown). Rather than forming the first device carrier 16 with conductive members 30, the device carrier could be fabricated with castellated leads.

Overlying the first device carrier 16, but spaced a short distance therefrom, is a second device carrier 33 for carrying the programmable memory device 14. Like the first device carrier 16, the second device carrier 33 comprises a substrate which has opposed, first and second surfaces 34 and 36. A plurality of second metallized areas 38 is arrayed on the surface 34 in a manner corresponding to an array of electrical contacts 40 on the programmable memory device 14. When the programmable memory device 14 takes the form of a semiconductor die as shown in FIG. 1, each electrical contact 40 is connected by a wire 42 to a separate metallized area 38, the wire being attached by a conventional wire-bonding process. An encapsulant 44 may be applied over the top of the programmable device 14 to protect both the device and the wires 42 bonded to it. Alternatively, the programmable memory device 14 could be configured of a packaged device with leads (not shown) rather than the semiconductor die shown in FIG. 1. Should the programmable memory device 14 take the form of a packaged device with leads, then each lead would be bonded to a corresponding one of the metallized areas 38.

Like the device carrier 16, the device carrier 33 has a plurality of conductive members 46 (e.g., low-temperature solder bumps) depending from its second major surface 36. Each conductive member 46 is bonded to separate one of a plurality of metallized areas (not shown) on the surface 36, arrayed the same as, and electrically connected to, the metallized areas 38. In practice, the number and arrangement of the contacts 40 on the programmable memory device 14 is different from the number and arrangement, respectively, of the contacts 26 on the processor 12. (The same is typically true when the processor 12 and the programmable memory device 14 each take the form of packaged devices.) As a consequence, the conductive members 46 (which are arrayed to correspond to the contacts 40 on the programmable memory device 14) differ in number and arrangement from the metallized areas 24 on the first device carrier 16, which are arrayed to correspond to the contacts 26 on the processor 12. For this reason, the conductive members 46 depending from the second device carrier 33 cannot be directly aligned with, for placement on, and hence connection to, the metallized areas 24 on the first device carrier 16.

Even if the conductive members 46 of the second device carrier 33 were arrayed the same as the metallized areas 24 on the first device carrier 16, the conductive members still could not be directly placed on the metallized areas. In practice, the degree to which the conductive members 46 depend below the second device carrier 33 is typically much less than the thickness (height) of the processor 12, let alone the height of the wires 28 connecting the processor to the metallized areas 24.

To facilitate an electrical connection between the first and second device carriers 16 and 33, the module 10 includes an interposer layer 48 sandwiched between the two device carriers. The interposer layer 48 typically comprises a substrate (e.g., ceramic, glass-epoxy, FR-4 or the like) having a thickness greater than the height of the wires 28. The interposer layer 48 has a central opening 50 sized to receive the processor 12 so that when the interposer layer overlies the first device carrier 16, as seen FIG. 2, there is no interference with the processor 12 or with the wires 28.

Like each of the device carriers 16 and 33, the interposer layer 48 has first and second opposed surfaces 52 and 54, respectively. A plurality of metallized areas 56 is arrayed on the first surface 52, whereas each of a plurality of conductive members 58 (e.g., conductive epoxy bumps, conductive polymer bumps, or solder bumps) depends from the surface 54. Each conductive member 58 is bonded to a metallized area (not shown) on the second surface 54, each such area being electrically connected to a corresponding one of the metallized areas 56. The conductive members 58 are arrayed the same as the metallized areas 24 so that when the interposer layer 48 is placed on the first device carrier 16 in the manner shown in FIG. 2, each conductive member 58 makes a physical and electrical contact with a separate one of the metallized areas 24.

Figure 2:
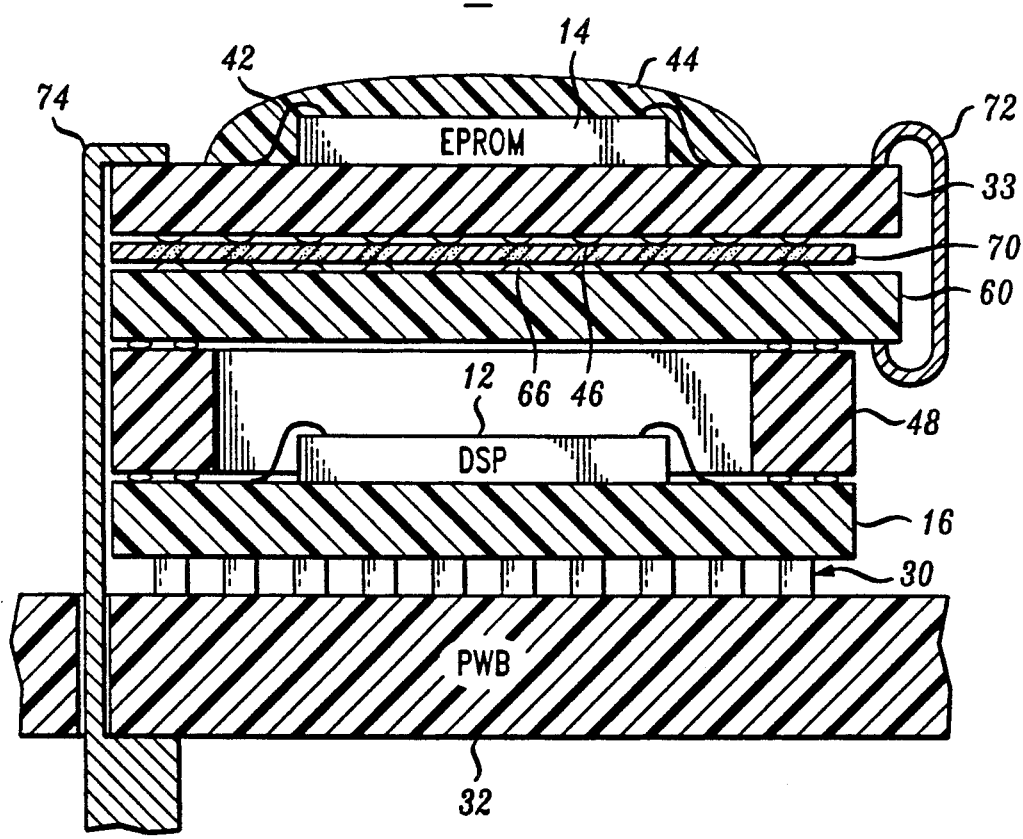
FIG. 2 is side view, in cross section, of the module of FIG. 1 taken along the plane 2—2 thereof.

To the extent possible, the metallized areas 56 on the surface 52 of the interposer layer 48 are arrayed the same as the conductive members 46 depending from the second device carrier 33. However, the need to provide the opening 50 centrally in the interposer layer 48 often may preclude the interposer layer from being fabricated to provide the necessary routing enabling the metallized areas 56 to be arrayed the same as the conductive members 46 on the second device carrier 33. For this reason, a separate routing layer 60 is shown in FIGS. 1 and 2 situated between the interposer layer 48 and the second device carrier 33.

The routing layer 60 typically comprises a substrate (e.g., ceramic, glass-epoxy, FR-4 or the like) having opposed major surfaces 62 and 64. A plurality of metallized areas 66 is arrayed on the surface 62 in the same manner as the conductive members 46 depending from the second device carrier 33. The second surface 64 of the routing layer 60 has a plurality of depending conductive members 68 (e.g., conductive epoxy bumps, conductive polymer bumps, or solder bumps). Each conductive member 68 is bonded to a metallized area (not shown) on the second surface 64 which, in turn, is connected to a separate one of the metallized areas 66 on the first surface 62 of the routing layer 60. Unlike the metallized areas 66 which are arrayed the same as the conductive members 46, the conductive members 68 are arrayed the same as the metallized areas 24 on the first device carrier. In this way, the routing layer 60, in combination with the interposer layer 48, effectively routes each conductive member 46 to each corresponding metallized area 24.

Sandwiched between the routing layer 60 and the second device carrier 33 is a conduction layer 70 which provides a conductive path (not shown) between each conductive member 46 on the second device carrier and each metallized area 66 on the routing layer. In practice, the conduction layer 70 comprises a slab of anisotropically conductive, elastomeric polymer interface material as is well known in the art. Such material, which is available from AT&T, Princeton, N.J., is comprised of an insulative matrix (not shown), made from silicone rubber or the like. Arranged in the matrix is a plurality of spaced-apart conductive members (not shown), each providing an electrically conductive path extending along the z axis of the slab between its opposed major surfaces.

Conceivably, the module 10 could be fabricated by placing the second device carrier 33 directly on the routing layer 60 (or directly on the interposer layer 48 if that layer were configured to perform the requisite routing) and then bonding them together by solder or conductive epoxy, thereby obviating the need for the conduction layer 70. Nonetheless, there is a distinct advantage to interposing the conduction layer 70 between the second device carrier 33 and the routing layer 60 (or the interposer layer 48 in the absence of the routing layer). When the second device carrier 33 is fabricated, there is likely to be some variation in length of the conductive members 46 depending below the surface 36. One or more of the conductive members 46 may be longer or shorter than the others. If the second device carrier 33 were placed directly on the routing layer 60 (or on the interposer layer 48), not every conductive member 46 may make contact with a corresponding one of the metallized areas 66 on the routing layer (or with a corresponding one of the metallized areas 52 on the interposer layer 48). However, the conduction layer 70 accommodates such variations in the height of the conductive members 46, assuring that each makes contact with the corresponding metallized area on the layer therebelow. Moreover, there is another advantage to employing the conduction layer 70. By providing the conduction layer 70 interposed between the second device carrier 33 and the routing layer 60 (or the interposer layer 48), the second device carrier can be made easily and rapidly removable.

Referring to FIG. 2, the module 10 includes at least a fastening mechanism 72, typically in the form of a clip or the like, which releasably secures the second device carrier 33 to the routing layer 60 such that the conduction layer 70 is compressed therebetween (typically, two or more clips 72 are provided). The routing later 60 is permanently secured to the interposer layer 48 by way of the conductive members 68, which as indicated, are formed of conductive epoxy, conductive polymer or solder. By the same token, the interposer layer 48 is permanently secured to the first device carrier 16 by the conductive members 58 which are also formed of conductive epoxy or solder. In the absence of the routing layer 60, each clip 72 would releasably secure the second device carrier 33 to the interposer layer 48. As an alternative to, or in addition to, each clip 72, a frame 74, extending through the printed wiring board 32 so as to bear against the underside thereof, could also be provided to releasably secure the second device carrier 33 against the conduction layer 70. Rather than employ the clips 72 or the frame 74, other types of releasable fasteners could be employed, such as screws or tapered pins for example.

Referring to FIG. 1, each of a pair of 76 pins protrudes from the interposer layer 48 in opposite directions into holes 78 in the first device carrier 16, the routing layer 60, the conduction layer 70, and the second device carrier 33. The pins 76 maintain the interposer layer 48, the routing layer 60, the conduction layer 70 and the second device carrier 33 in alignment with the first device carrier 16. In this way, the conductive members 46 on the second device carrier 33 will be be maintained in proper registration with the metallized areas 56 on the interposer layer 48 while the conductive members 58 on the interposer layer are maintained in registration with the metallized areas 24 on the first device carrier 16. Thus, a conductive path is assured between each conductive member 46 of the second device carrier 33 and a corresponding metallized area 24 on the first device carrier 16.

A distinct advantage of the module 10 is that its area is not substantially bigger than the processor 12, yet the module advantageously accommodates both the processor and the programmable memory device 14. Moreover, the module 10 affords the advantage of allowing the second device carrier 33 to be releasably detached from the first device carrier 16, thereby allowing the programmable memory device 14 to be programmed off-line so as to eliminate possible damage to the processor 12 caused by relatively high voltages being applied to the memory device. Further, the arrangement of the conductive members 30 on the second device carrier can be chosen the same as those on a conventional mask-programmed processor (not shown) so both have the same "footprint," thereby allowing replacement of the module with the mask-programmed processor if desired.

It is to be understood that the above-described embodiments are merely illustrative of the principles of the invention. Various modifications and changes may be made thereto by those skilled in the art which will embody the principles of the invention and fall within the spirit and scope thereof.

I claim:

1. An electronic module comprising:

a first device carrier having a plurality of first metallized areas arrayed on a first surface and a plurality of first conductive members depending from a second, opposed surface, each first conductive member electrically connected to a separate first metallized area;

a processor carried on the first surface of the first device carrier and having a plurality of electrical contacts, each electrically coupled to a separate first metallized area;

a second device carrier in spaced registration above the first device carrier, the second device carrier having a plurality of second metallized areas arrayed on a first surface and a plurality of second conductive members extending below a second, opposed surface and arrayed differently than the first metallized areas, each second conductive member electrically connected to a separate second metallized area;

a programmable memory device carried on the first surface of the second device carrier and the device having a plurality of electrical contacts each coupled to a separate second metallized area;

an intermediate layer overlying the first surface of the first device carrier and having an opening sized to receive the processor, the intermediate layer having a plurality of third metallized areas on a first surface arrayed the same as the second conductive members, and a plurality of third conductive members depending from a second, opposed major surface, each aligned for electrical contact with, and attachment to, a separate one of the first metallized areas, each third conductive member electrically connected to a corresponding third metallized area;

a conduction layer interposed between the intermediate layer and the second device carrier for providing a conductive path between each third metallized area and each second conductive member; and means for releasably securing the second device carrier and the conduction layer to the intermediate layer so that the first and second device carriers are stacked one above the other.

2. The module according to claim 1 wherein the intermediate layer comprises:

an interposer layer having an opening centrally located therein, the interposer layer having an array of metallized areas on a first surface and an array of conductive members on a second, opposed surface, arrayed the same as the first metallized areas on the first device carrier, each metallized area electrically connected to each conductive member; and a routing layer overlying the interposer layer, the routing layer having a plurality of metallized areas on a first surface arrayed the same as the second conductive members on the second device carrier, and a plurality of conductive members on a second, opposed surface arrayed the same as the third metallized areas on the interposer layer, each metallized area on the first surface of the routing layer electrically connected to a separate conductive member on the second surface thereof.

3. The module according to claim 2 wherein each conductive member on the routing layer and on the interposer layer comprises a conductive epoxy bump.

4. The module according to claim 1 wherein each first conductive member comprises a high-temperature solder bump.

5. The module according to claim 1 wherein each second conductive member comprises a low-temperature solder bump.

6. The module according to claim 1 wherein the conduction layer comprises a slab of anisotropically conductive, elastomeric polymer interface material.

7. The module according to claim 1 wherein the retaining means comprises at least one clip.

8. The module according to claim 1 further including a plurality of pins, protruding through the intermediate layer and the engaging device carriers, the conduction layer, and the second device carrier to maintain them in alignment with each other.

9. The module according to claim 1 wherein the processor and the programmable memory are each comprised of an unpackaged semiconductor die.

* * * * *